US011192450B2

(12) United States Patent
Carvalho et al.

(10) Patent No.: US 11,192,450 B2
(45) Date of Patent: Dec. 7, 2021

(54) MOTOR VEHICLE OPERATING DEVICE

(71) Applicant: BCS AUTOMOTIVE INTERFACE SOLUTIONS GMBH, Radolfzell (DE)

(72) Inventors: Nelson Carvalho, Aach (DE); Pawel Borowczyk, Czestochowa (PL); Steffen Sornberger, Hilzingen/Twiefeld (DE); Helmut Sowig, Villingen-Schwenningen (DE); Viktor Beliuzhenko, Constance (DE); Leandro Conde, Singen (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 134 days.

(21) Appl. No.: 16/623,149

(22) PCT Filed: Jun. 20, 2018

(86) PCT No.: PCT/EP2018/066377
§ 371 (c)(1),
(2) Date: Dec. 16, 2019

(87) PCT Pub. No.: WO2018/234365
PCT Pub. Date: Dec. 27, 2018

(65) Prior Publication Data
US 2021/0146778 A1 May 20, 2021

(30) Foreign Application Priority Data

Jun. 21, 2017 (DE) ..................... 10 2017 113 661.4

(51) Int. Cl.
*B60K 35/00* (2006.01)
*H03K 17/96* (2006.01)

(52) U.S. Cl.
CPC .......... *B60K 35/00* (2013.01); *H03K 17/962* (2013.01); *B60K 2370/1434* (2019.05); *B60K 2370/167* (2019.05); *B60K 2370/345* (2019.05)

(58) Field of Classification Search
CPC combination set(s) only.
See application file for complete search history.

(56) References Cited

U.S. PATENT DOCUMENTS 5,876,243 A * 3/1999 Sangawa .................. H01H 9/04
439/519
6,072,475 A 6/2000 Van Ketwich
(Continued)

FOREIGN PATENT DOCUMENTS

DE 102011116275 A1 4/2013
DE 10201202456 A1 8/2013
(Continued)

*Primary Examiner* — Chico A Foxx
(74) *Attorney, Agent, or Firm* — McNees Wallace & Nurick LLC

(57) ABSTRACT

There is described a motor vehicle control device (10), comprising an at least partly electrically conductive control unit (16) including a control surface (20) and a printed circuit board (43) associated to the control unit (16), which comprises several electrodes (44). The control unit (16) includes at least one actuating area (30) which is provided on a capacitive actuating element (32) protruding from the control surface (20) to the outside, in particular wherein the at least one actuating area (30) is provided on a side face (34) of the actuating element (32), which is substantially vertical to the control surface (20).

13 Claims, 5 Drawing Sheets

(56) References Cited

U.S. PATENT DOCUMENTS

| | | | | |
|---|---|---|---|---|
| 7,297,884 B2* | 11/2007 | Shimizu | H01H 13/06 | |
| | | | 200/302.1 | |
| 8,239,087 B2* | 8/2012 | Dybalski | B60K 37/06 | |
| | | | 701/29.1 | |
| 8,547,114 B2* | 10/2013 | Kremin | H03M 11/02 | |
| | | | 324/678 | |
| 8,994,689 B2* | 3/2015 | Pandher | E05F 15/695 | |
| | | | 345/174 | |
| 9,353,557 B2* | 5/2016 | Sanborn | E05B 81/76 | |
| 9,496,296 B1* | 11/2016 | Landt | H01L 31/08 | |
| 9,897,203 B2* | 2/2018 | Pfeifer | F16H 59/105 | |
| 10,235,015 B2* | 3/2019 | Wengelnik | G06F 3/0488 | |
| 10,240,385 B2* | 3/2019 | Park | E05F 15/697 | |
| 10,534,482 B2* | 1/2020 | Wang | G06F 3/044 | |
| 10,752,190 B1* | 8/2020 | Buckley | E05F 15/60 | |
| 10,884,614 B1* | 1/2021 | Austria | G06F 3/04883 | |
| 2003/0071784 A1* | 4/2003 | Sato | G06F 3/0446 | |
| | | | 345/156 | |
| 2005/0098417 A1* | 5/2005 | Miyako | B60K 37/06 | |
| | | | 200/61.54 | |
| 2006/0185968 A1* | 8/2006 | Dzioba | G07C 9/00714 | |
| | | | 200/5 R | |
| 2007/0265745 A1* | 11/2007 | Styles | B60W 50/10 | |
| | | | 701/36 | |
| 2007/0291013 A1* | 12/2007 | Won | G06F 3/03547 | |
| | | | 345/173 | |
| 2008/0001926 A1* | 1/2008 | XiaoPing | G06F 3/0445 | |
| | | | 345/173 | |
| 2008/0140282 A1* | 6/2008 | Ando | B60Q 3/82 | |
| | | | 701/36 | |
| 2008/0143681 A1* | 6/2008 | XiaoPing | G06F 3/0445 | |
| | | | 345/173 | |
| 2008/0191715 A1* | 8/2008 | Schediwy | G06F 3/03547 | |
| | | | 324/663 | |
| 2008/0302014 A1* | 12/2008 | Szczerba | B60K 35/00 | |
| | | | 49/31 | |
| 2008/0309170 A1* | 12/2008 | Ando | H03K 17/962 | |
| | | | 307/125 | |
| 2009/0262548 A1* | 10/2009 | Ando | B60Q 3/82 | |
| | | | 362/544 | |
| 2011/0221689 A1* | 9/2011 | Nanri | G06F 3/03547 | |
| | | | 345/173 | |
| 2011/0248954 A1* | 10/2011 | Hamada | G06F 3/03547 | |
| | | | 345/174 | |
| 2012/0327010 A1* | 12/2012 | Lee | G06F 3/03547 | |
| | | | 345/173 | |
| 2013/0187889 A1* | 7/2013 | Pandher | H03K 17/9622 | |
| | | | 345/174 | |
| 2013/0342331 A1* | 12/2013 | Fukushima | G06F 3/03547 | |
| | | | 340/407.2 | |
| 2014/0055397 A1 | 2/2014 | Becker et al. | | |
| 2014/0082873 A1* | 3/2014 | Huth | B60K 37/02 | |
| | | | 15/250.01 | |
| 2014/0236454 A1* | 8/2014 | Mattes | G06F 3/04883 | |
| | | | 701/102 | |
| 2015/0227163 A1* | 8/2015 | Molard | G06F 3/03547 | |
| | | | 345/174 | |
| 2015/0253753 A1* | 9/2015 | Bennett | G06F 3/0488 | |
| | | | 700/83 | |
| 2016/0026268 A1* | 1/2016 | Chassot | G06F 3/03547 | |
| | | | 345/158 | |
| 2016/0026283 A1* | 1/2016 | Lo | G06F 3/0338 | |
| | | | 345/173 | |
| 2016/0305178 A1* | 10/2016 | Disley | B60J 1/17 | |
| 2017/0253121 A1* | 9/2017 | Kwon | B60N 2/0248 | |
| 2017/0280533 A1* | 9/2017 | Dimberg | H01H 23/16 | |
| 2017/0362878 A1* | 12/2017 | Gage | E05F 15/75 | |
| 2018/0032158 A1* | 2/2018 | Hotelling | G06F 21/31 | |
| 2018/0107294 A1* | 4/2018 | Stotzem | B62D 1/046 | |
| 2018/0329623 A1* | 11/2018 | Usami | G06F 3/03547 | |
| 2018/0364832 A1* | 12/2018 | Kong | G06F 3/0416 | |
| 2018/0367139 A1* | 12/2018 | Pribisic | H03K 17/9622 | |
| 2019/0047605 A1* | 2/2019 | Clochard | B62D 1/06 | |
| 2019/0138126 A1* | 5/2019 | Higuchi | G06F 3/016 | |
| 2019/0218836 A1* | 7/2019 | Trabucco | E05B 85/12 | |
| 2019/0278386 A1* | 9/2019 | Masthoff | B60K 35/00 | |
| 2019/0346974 A1* | 11/2019 | Lin | G06F 3/0447 | |
| 2020/0019301 A1* | 1/2020 | Kolb | G06F 3/04883 | |
| 2020/0026370 A1* | 1/2020 | Shin | B60K 37/06 | |
| 2020/0105482 A1* | 4/2020 | Kosugi | B60R 11/0264 | |
| 2020/0174625 A1* | 6/2020 | Lin | G06F 3/0443 | |
| 2021/0053512 A1* | 2/2021 | Perona | G06F 3/044 | |

FOREIGN PATENT DOCUMENTS

| | | |
|---|---|---|
| DE | 102012206661 A1 | 10/2013 |
| DE | 102014011164 A1 | 1/2016 |
| DE | 102014207976 A1 | 1/2016 |
| DE | 102009001412 A1 | 9/2020 |
| FR | 3039792 A1 | 10/2017 |

\* cited by examiner

MOTOR VEHICLE OPERATING DEVICE

RELATED APPLICATIONS

This application filed under 35 U.S.C § 371 is a national phase application of International Application Number PCT/EP2018/066377, filed Jun. 20, 2018, which claims the benefit of German Application No. 10 2017 103 661.4 filed Jun. 21, 2017, the subject matter of which are incorporated herein by reference in their entirety.

BACKGROUND

The invention relates to a motor vehicle control device which is arranged for example in an instrument panel or a motor vehicle door.

From the prior art motor vehicle control devices are known, which for example are formed as a window lifter module via which a vehicle occupant among other things can actuate a window, in particular open or close the window. Furthermore, such motor vehicle control devices comprise further functions, such as folding in and out of the side-view mirrors, heating of the side-view mirrors and the mirror adjustment in general.

Usually, the different functions are formed by separate control devices, wherein for example the window lifters are formed via mechanical rocker or toggle switches which are moved mechanically, in order to produce a mechanical contact between two electrodes, so that the corresponding function is executed.

Beside the mechanical control elements capacitive control elements furthermore are known in modern motor vehicles, which recognize an approach to or touch of the corresponding control element by a control object, for example a finger of the vehicle occupant. The capacitive control elements have the advantage that they exhibit less wear than the mechanical control elements.

For safety reasons, however, capacitive control elements have not been used so far in window lifter modules, as an inadvertent touch or approach might lead to the fact that the window closes, which represents a potential safety risk, in case no additional safety devices are provided.

It is the object of the invention to provide a motor vehicle control device which is easy and inexpensive to manufacture and also is long-lived.

SUMMARY

According to the invention the object is solved by a motor vehicle control device, comprising an at least partly electrically conductive control unit including a control surface and a printed circuit board associated to the control unit, which comprises several electrodes, wherein the control unit includes at least one actuating area which is provided on a capacitive actuating element protruding from the control surface to the outside, in particular wherein the at least one actuating area is provided on a side face of the actuating element which is substantially vertical to the control surface.

It is the idea underlying the invention that a capacitive actuating element is provided, which protrudes to the outside from the control surface which substantially is parallel to the printed circuit board. The actuating element provides the corresponding actuating area to which a function is associated. In case the capacitive actuating area also is arranged on a side face of the corresponding actuating element, which substantially is vertical to the control surface, it is ensured that an inadvertent actuation of the actuating element can be excluded. Thus, a corresponding safety-relevant function can be associated to the capacitive actuating element, for example the function "close window".

The actuating element can be formed integrally with the control unit, i.e. as a protrusion protruding to the outside, which forms a corresponding side face. The protrusion protruding to the outside extends away from the printed circuit board.

One aspect provides that the control unit is formed such that the capacitive actuating element protruding from the control surface to the outside is to be contacted on two actuating surfaces at the same time, in order to activate an associated function. The actuating area accordingly is formed by the two actuating surfaces. As the two actuating surfaces must be contacted at the same time, in order to activate the associated function, a higher safety level is ensured. For example, by touching the two actuating surfaces at the same time an automated function "close window" is initiated.

Therefore, the motor vehicle control device may be a motor vehicle control device which includes a capacitive actuating element protruding to the outside, which has at least one capacitive actuating area which is provided on a side face of the actuating element which is substantially vertical to a surface.

Furthermore, two actuating surfaces are provided on the capacitive actuating element protruding to the outside. They have to be contacted simultaneously in order to activate an associated function.

In this respect, the capacitive actuating element protruding to the outside is an actuating element which can for example be actuated by the thumb and the index finger, wherein the associated function is only activated when both the thumb and the index finger contact the capacitive actuating element on the associated actuating surfaces on the corresponding side face. An inadvertent contacting can thus be effectively excluded.

In particular, the two actuating surfaces are provided on opposite surfaces of the actuating element. A further safety level thereby is created, as an inadvertent actuation of the two actuating surfaces arranged on opposite surfaces of the actuating element can be excluded. Correspondingly, it is ensured that the function is intended, in case both actuating surfaces are simultaneously touched by an actuating object such as a finger. The opposite surfaces in particular are two opposite side faces of the capacitive actuating element.

A further aspect provides that a control area is provided, which in particular is formed as a capacitive sliding area. The control area can serve for actuating a corresponding function, i.e. a selection and/or a confirmation. Furthermore, a sliding movement of a control object over the capacitive sliding area can be detected, in order to initiate an associated function, for example the function "open window". In contrast to the actuating area, the control area can be provided in the plane of the control surface, so that the control area and the actuating area are arranged substantially vertically to each other.

The control area provided on the actuating element likewise can be formed as a sliding area.

According to one embodiment at least one adjusting area is provided on the control surface, which comprises control areas formed on the control surface. The adjusting area can be a mirror adjusting area, via which the mirror surface in the outside mirrors is adjusted. Correspondingly, the adjusting area includes at least four different control areas which are provided for the four different directions in which the mirror can be adjusted. In addition, the adjusting area can comprise a control area formed as confirmation area, via which selected functions can be confirmed. To the control area formed as confirmation area an initiation function furthermore can be associated, via which a function associated to a control area is initiated.

According to a further aspect a function display area is provided on the control surface, via which a selected function is displayed, when the same is selected. The function display area can merely serve to display a selected function, so that corresponding function symbols are displayed in the function display area, which can be backlit. The actuation of the respective function can be effected via the adjusting area, so that a function can be selected via correspondingly formed cursor control areas.

Furthermore, a search illumination and/or a selection illumination can be provided. The search illumination for example can be associated to the actuating element, in particular the actuating area, the control area, in particular the control area formed as capacitive sliding area, the adjusting area and/or the function display area. The search illumination can be activated via a capacitive sensor which detects an approach of a control object to the control surface of the motor vehicle control device. The selection illumination can exclusively be associated to the function display area, so that a correspondingly selected function is illuminated via the selection illumination, in order to indicate to the vehicle occupant which of the several functions currently is activated.

One aspect provides that the printed circuit board includes at least one light transmission opening. Correspondingly, light sources which serve for backlighting the control surface and/or the actuating element, in particular the actuating area, can be arranged below the printed circuit board, so that the light emitted by the same impinges on the rear side of the control surface through the correspondingly formed light transmission opening, in order to backlight function symbols, switching symbols, control areas or the like. It thereby is ensured that the printed circuit board can be arranged as close as possible to the control surface, whereby capacitive sensor elements or capacitive actuating elements can be formed correspondingly.

According to one embodiment at least one light guide is provided, which is associated to the printed circuit board, in particular wherein the at least one light guide is associated to the at least one light transmission opening. Correspondingly, few light sources can be provided, in order to illuminate large-surface areas of the control surface and/or of the actuating area, to which corresponding light guides are associated. The light guides in particular are part of the search illumination, so that upon activation of the search illumination the corresponding areas are homogeneously and uniformly illuminated via the light guide.

In general, the search illumination can be activated via an approach to the control surface, which correspondingly is capacitively detected.

Furthermore, the control unit can be formed as a trim which comprises several switching symbols and/or function symbols which at least include transparent portions. The corresponding switching symbols and/or function symbols or their transparent portions are backlit by the at least one light source which cooperates with the light guide, in order to make the corresponding symbols visible for the vehicle occupant. The symbols are associated to the control areas and/or the function display area.

According to one embodiment the motor vehicle control device is a window lifter module. Correspondingly, functions such as "open window" or "close window" among other things are associated to the motor vehicle control device.

DESCRIPTION OF THE DRAWINGS

Further advantages and properties of the invention can be taken from the following description and the drawings to which reference is made. In the drawings.

DETAILED DESCRIPTION

Figure 1:
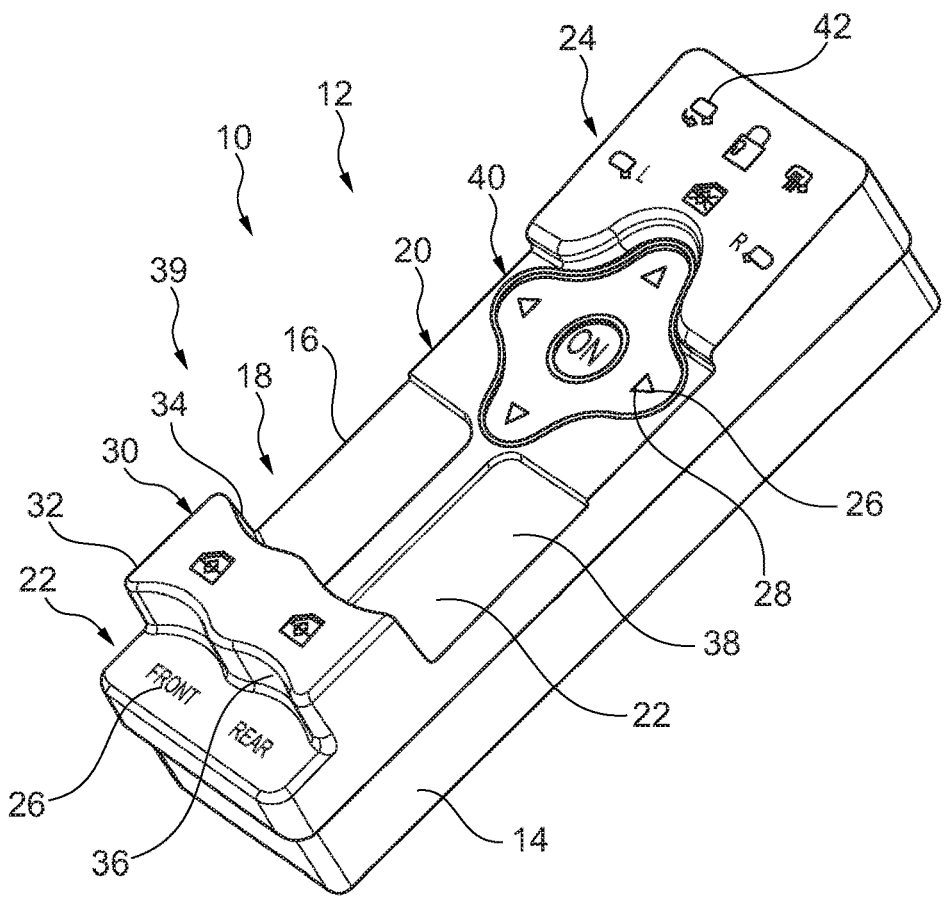
FIG. 1 shows a perspective view of a motor vehicle control device of the invention according to a first embodiment.

FIG. 1 shows a motor vehicle control device 10 formed as a window lifter module 12 which can be arranged in a motor vehicle door.

Figure 3:
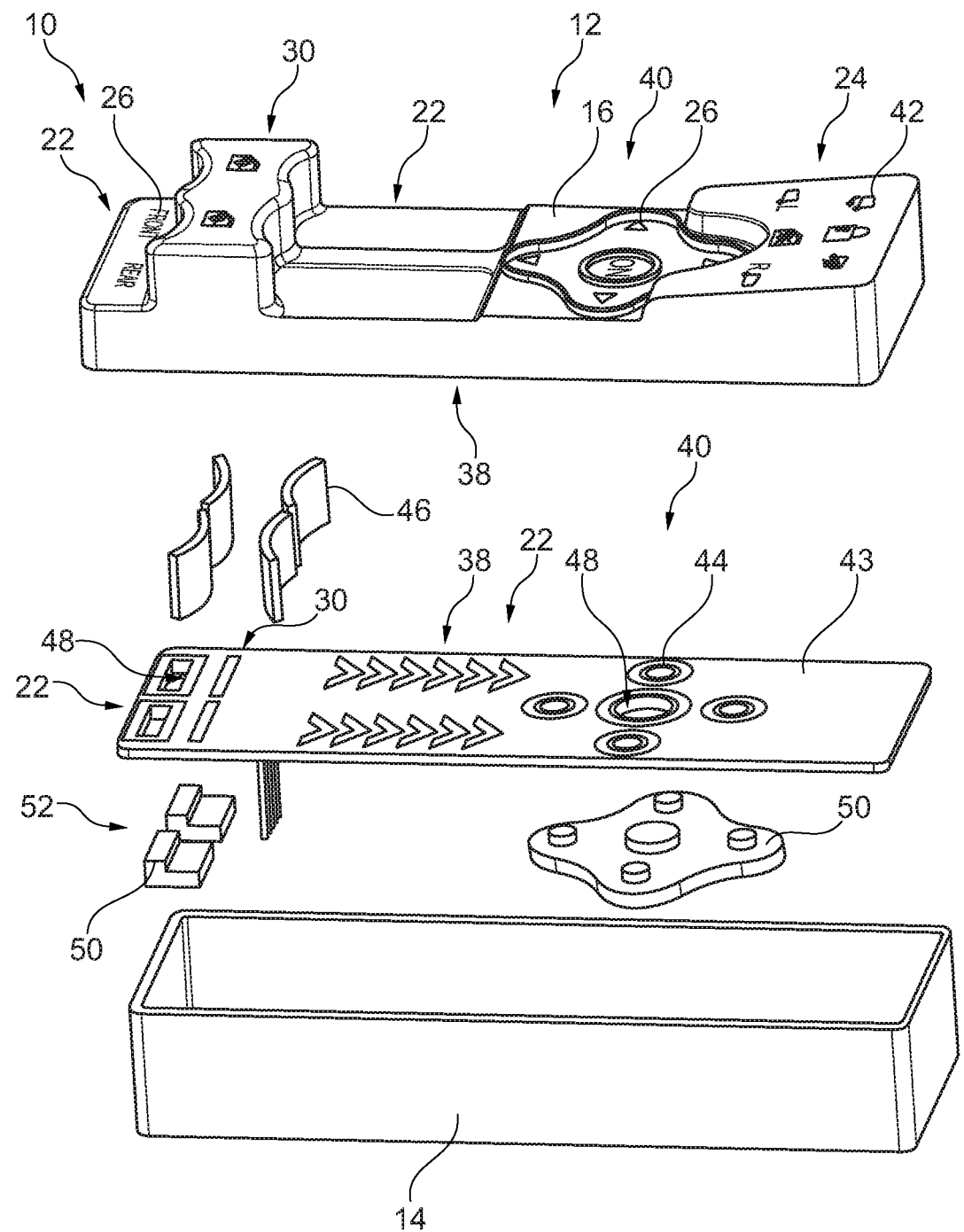
FIG. 3 shows an exploded view of the motor vehicle control device according to FIGS. 1 and 2.

In the illustrated embodiment the motor vehicle control device 10 includes a base body 14 as well as a control unit 16 arranged on the base body 14, which is formed as a trim 18, as can in particular be taken from FIG. 3 which shows the motor vehicle control device 10 in an exploded representation.

The control unit 16 includes a control surface 20 which at least partly is electrically conductive, wherein the control surface 20 of the control unit 16 forms several control areas 22 as well as a function display area 24.

For this purpose, switching symbols 26 are provided in the control surface 20, which at least comprise transparent portions 28 which can be backlit, as will yet be explained below.

An actuating area 30 is provided on a capacitive actuating element 32 which protrudes from the control surface 20 to the outside, wherein the actuating area 30 is formed on a side face 34 of the actuating element 32, which is oriented substantially vertically to the control surface 20 of the control unit 16. In so far, the actuating area 30 is arranged vertically to the control areas 22 formed in the control surface 20.

The actuating area 30 is formed via two actuating surfaces 36 which are provided on the corresponding opposite side faces 34 of the actuating element 32. Correspondingly the function associated to the actuating element 32 or the actuating area 30 only is activated when a vehicle occupant contacts the two actuating surfaces 36 provided on the opposite side faces 34 at the same time. It thereby is ensured that an inadvertent actuation of the function stored for the actuating area 30 can be excluded. For example, the function "close window" is associated to the actuating area 30, so that inadvertent closing of the windows is effectively prevented.

The motor vehicle control device 10 comprises a first control area 22 which is linked with the actuating area 30.

In the illustrated embodiment the first control area 22 is a selection area in which a selection can be made between the front windows and the rear windows. Correspondingly, to the first control area 22 two switching symbols 26 with transparent portions 28 are associated, which can be backlit, as will yet be explained below.

Furthermore, the motor vehicle control device 10 comprises a second control area 22 which is formed as a capacitive sliding area 38. The capacitive sliding area 38 accordingly detects a sliding movement by means of a control object along the capacitive sliding area 38, in order to execute a stored function, for example the function "open window".

The corresponding sliding surfaces formed in the capacitive sliding area 38 can be arranged obliquely, so that it is ensured that water accumulating in this region can flow off via the oblique sliding surfaces.

Figure 2:
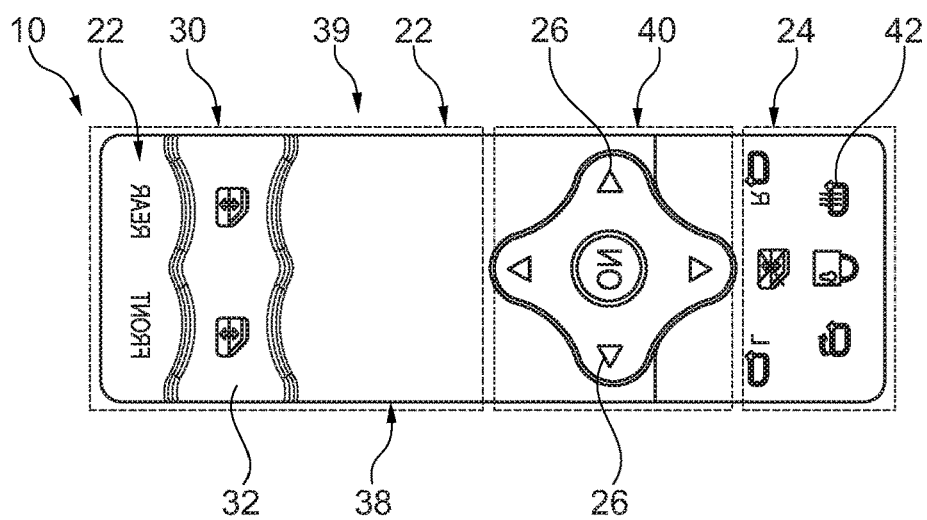
FIG. 2 shows a top view of the motor vehicle control device according to FIG. 1.

The actuating area 30 and the first two control areas 22 together form a window lifting area 39, via which the different functions of the windows can be controlled, i.e. "open window" and "close window", respectively. This is illustrated in FIG. 2.

Beside these control areas 22 and the actuating area 30 the motor vehicle control device 10 furthermore comprises an adjusting area 40 which comprises switching symbols 26 formed on the control surface 20. The switching symbols 26 are formed on a coherent cursor control area to which several functions can be associated in principle.

For example, via the cursor control area, which is formed by the corresponding switching symbols 26, the different functions can be selected, which in the function display area 24 are represented via corresponding transparent portions 28. For this purpose, the cursor control area is operated corresponding to the arrow keys represented on the switching symbols 26. With the corresponding cursor control area it accordingly is possible to move through the several functions available.

To acknowledge a particular function, the adjusting area 40 includes a switching symbol 26 formed as confirmation surface, which can be actuated, in order to activate the corresponding function displayed in the function display area 24.

The symbols represented in the function display area 24 represent function symbols 42, which in the illustrated embodiment cannot be actuated directly. Rather, they merely serve to display a function selected via the adjusting area 40, in particular the cursor control area, in that the corresponding function symbol 42 is backlit.

For example, it is represented in the function display area 24 that the left or the right mirror can be selected. In case the left or the right mirror has been selected, it subsequently is possible to adjust the same via the adjusting area 40, in particular the cursor control area.

In general, the motor vehicle control device 10 accordingly can be subdivided into three different areas, as can be taken from FIG. 2, which shows a top view of the motor vehicle control device 10. A first area corresponds to the window lifter area 39, a second area corresponds to the adjusting area 40, and a third area corresponds to the function display area 24. Correspondingly, the motor vehicle control device 10, in particular the control unit 16, can be of the capacitive type merely in the first two areas, i.e. in the window lifter area 39 and in the adjusting area 40.

This can be ensured by the fact that a printed circuit board 43 associated to the control surface 20, which comprises several electrodes 44, is formed such that the corresponding electrodes 44 only are associated to the first two areas, i.e. the window lifter area 39 and the adjusting area 40. This is illustrated in FIG. 3, which shows the corresponding different electrodes 44 which are associated to the window lifter area 39 and the adjusting area 40. To the function display area 24 no electrodes 44 are associated, as no operation is effected thereby, but merely a display of the selected function.

Furthermore, FIG. 3 reveals that the motor vehicle control device 10 comprises separately formed contacts 46 which are associated to the side faces 34 and to the actuating surfaces 36 of the actuating element 32, in order to ensure an electrical connection between the electrodes 44 provided on the printed circuit board 43 and the corresponding actuating surfaces 36.

FIG. 3 in particular shows that the control unit 16 is formed in one part, so that a closed surface is created. The actuating element 32 accordingly is a protrusion of the control unit 16, which protrudes from the control surface 16 in which the control areas 22 substantially are formed. The control surface 16 substantially is parallel to the printed circuit board 43.

It also is shown that the printed circuit board 43 comprises several light transmission openings 48 which are aligned with light guides 50 and the switching symbols 26 to be backlit. This ensures that the light coupled into the light guide 50 shines from a non-illustrated light source through the corresponding light transmission openings 48 in the printed circuit board 43, in order to backlight the corresponding switching symbols 26 or their transparent portions 28.

The light guide 50 associated to the adjusting area 40 as well as the light guide 50 associated to the first control area 22 can be associated to a search illumination 52 via which the entire adjusting area 40 can be illuminated, in particular the corresponding switching symbols 26 provided in the adjusting area 40, in case an approach of a control object to the control surface 20 has been detected. The detection of this approach can be effected via the capacitive control unit 16.

In the illustrated embodiment of FIG. 3, no light guide 50 is associated to the function display area 24, as the corresponding function symbols 42 are backlit merely when selected, which is effected via a selection illumination which is not shown here.

Figure 4:
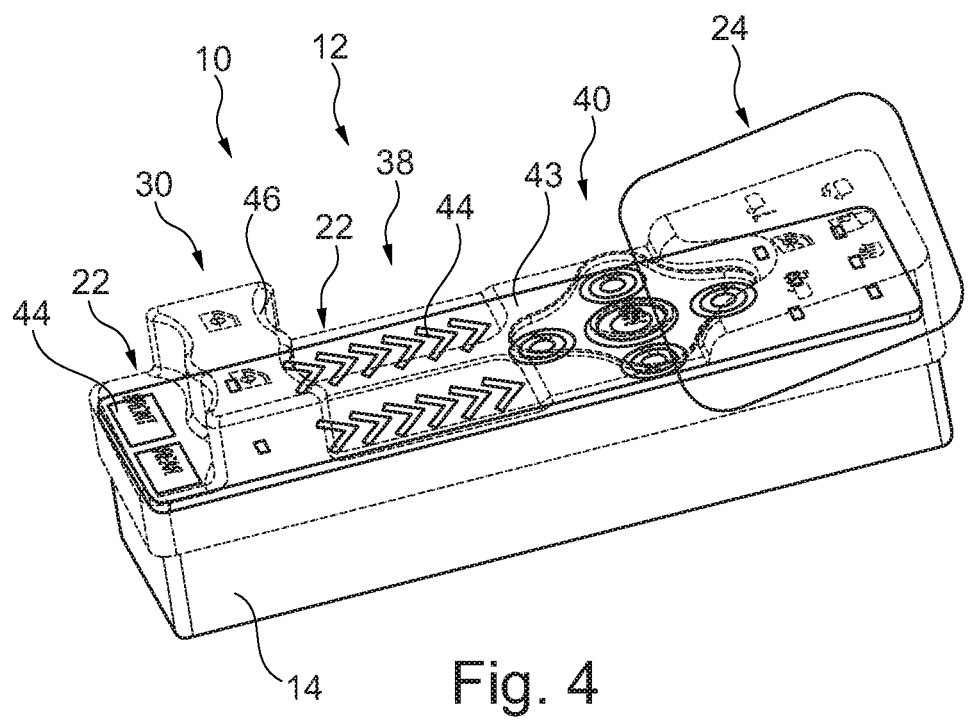
FIG. 4 shows a partly transparent representation of a motor vehicle control device according to the invention.

FIG. 4 reveals, however, that light sources which are arranged on the printed circuit board 43 can be associated to the function symbols 42.

The components of the motor vehicle control device 10, in particular the printed circuit board 43, are arranged in the base body 14 which is sealed to the outside by the control unit 16, when the motor vehicle control device 10 is in the assembled condition.

Figure 5:
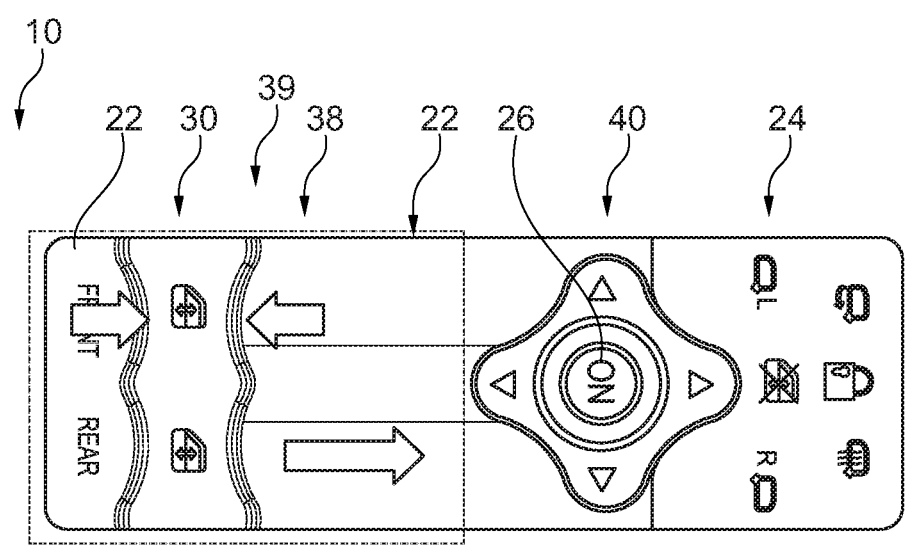
FIG. 5 shows a top view of a motor vehicle control device according to the invention, wherein actuating patterns are represented.

With reference to FIG. 5 it will be explained below how the window lifting area 39 can be actuated, in order to execute the desired functions.

For example, the function "open window" can be realized by first selecting in the first control area 22 whether the front or rear window row is to be actuated. For this purpose, the vehicle occupant can simply press onto the corresponding switching symbol 26. As the first control area 22 is of the capacitive type, a touch is sufficient.

It can furthermore be provided that an approach to the corresponding switching symbol 26 already is sufficient to ensure the desired function or selection.

After the front or rear window row has been selected via the first control area 22, the vehicle occupant can open the window by sliding his/her finger over the second control area 22, i.e. the capacitive sliding area 38, wherein the sliding movement is detected, so that the function "open window" correspondingly is initiated.

For the function "close window" different control logics are available, which are associated to different safety levels.

On a first safety level the function "close window" can be selected and initiated by the vehicle occupant touching an actuating surface 36 on a side face 34 of the actuating element 32, which is arranged vertically to the control surface 20.

On a second safety level two actuating surfaces 36 must be touched at the same time, in order to activate the function "close window". The two actuating surfaces 36 can be arranged on opposite surfaces of the actuating element 32, whereby the safety level is increased correspondingly.

According to a third safety level it can be provided that touching of the actuating element 32 subsequently also is acknowledged via the adjusting area 40, in particular the switching symbol 26 formed as confirmation control area.

In general, the function "close window" is associated to the actuating area 30 which is substantially vertical to the remaining control areas 22, in order to be able to exclude an inadvertent actuation.

Figure 6:
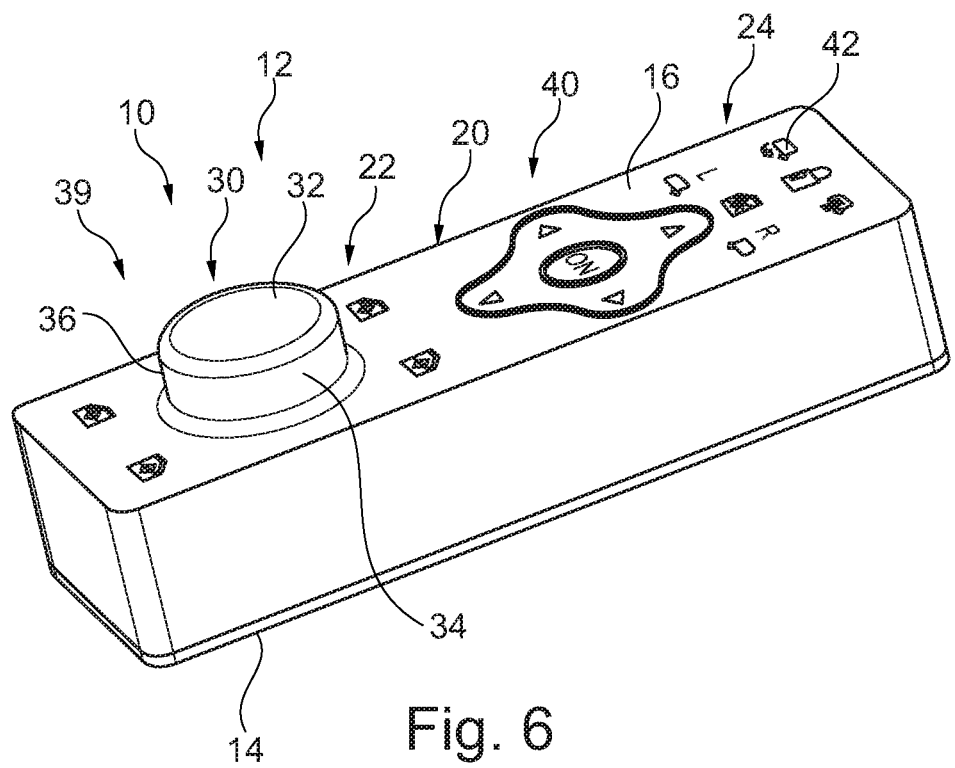
FIG. 6 shows a perspective view of a motor vehicle control device of the invention according to a second embodiment.
Figure 7:
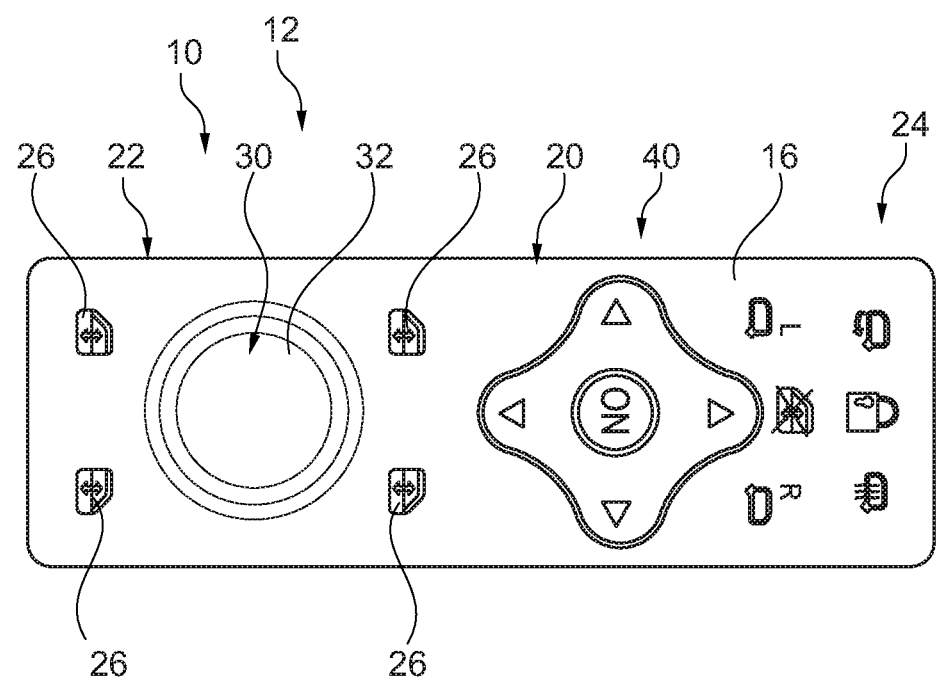
FIG. 7 shows a top view of the motor vehicle control device according to FIG. 6.

FIGS. 6 and 7 show an alternative embodiment which differs from the embodiment shown in FIGS. 1 to 5 merely by the fact that the actuating element 32 is formed as a substantially round, protruding actuating element.

The functions of the window lifting area 39 will be explained below for this embodiment.

The vehicle occupant can directly select the corresponding window via the four displayed switching symbols 26, i.e. the front left window, the front right window, the rear left window or the rear right window. For this purpose, the vehicle occupant merely must touch the corresponding switching symbol 26.

The four switching symbols 26 which are associated to the windows represent the first control area 22, which in this embodiment extends around the actuating element 32.

For opening and closing the corresponding, selected window the actuating element 30 is used, which likewise is arranged in a manner protruding from the control surface 20 to the outside. The corresponding circumferential side face 34 of the actuating element 32 can be formed as a sliding area, so that a sliding movement along the side face 34 is detected and converted into a corresponding function.

For example, a clockwise sliding movement means that the window is to be opened, whereas an anticlockwise sliding movement means that the window is to be closed. This can also be the other way round.

Furthermore, the actuating element 32 can detect whether the side face 34 is touched with one or two fingers at the same time, so that for example the function "close window" only is executed when two fingers contact the actuating element 32 at the same time.

On a further safety level it can be provided that the function "close window" subsequently must be acknowledged in the corresponding adjusting area 40 via the switching symbol 26 formed as confirmation control area, as this has likewise been the case for the third safety level according to the first embodiment of the motor vehicle control device 10.

The further functions are obtained in a way analogous to the first embodiment, to which reference is made correspondingly, in particular with regard to the selection of the functions via the adjusting area 40 and the display in the function display area 24.

In this embodiment the window lifter area 39 is formed by the actuating element 32 and the surrounding control area 22, which comprises the four switching symbols 26.

Figure 8:
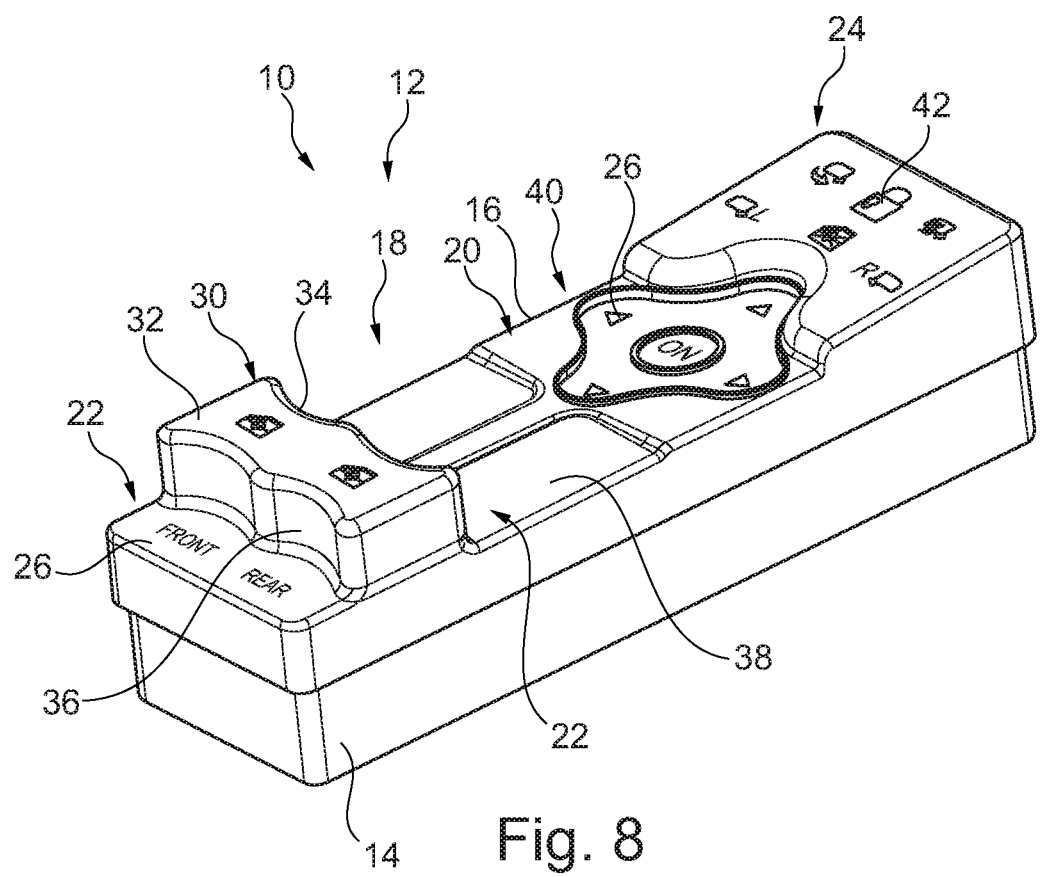
FIG. 8 shows a perspective view of a motor vehicle control device of the invention according to a third embodiment.
Figure 9:
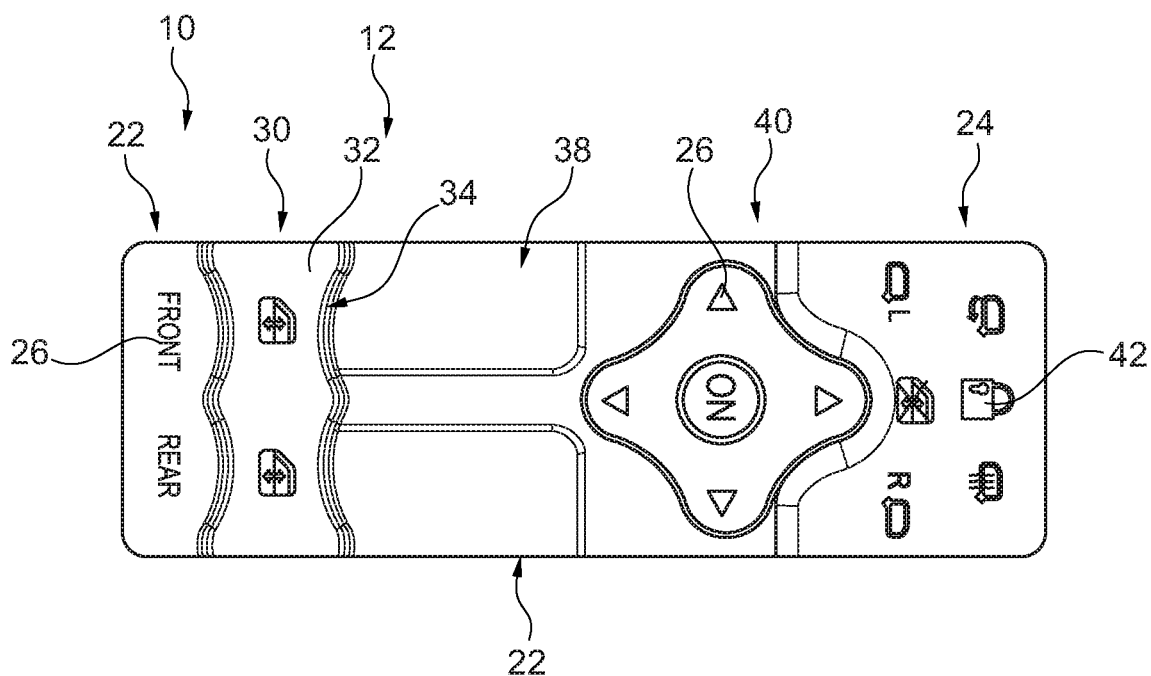
FIG. 9 shows a top view of the motor vehicle control device according to FIG. 8.

FIGS. 8 and 9 show another embodiment of the motor vehicle control device 10, which merely differs from the first embodiment according to FIGS. 1 to 5 in that the different switching and function symbols 26, 42 are shown differently, wherein for example in the embodiment of the motor vehicle control device 10 as shown in FIGS. 8 and 9 larger transparent portions 28 are provided in the switching and function symbols 26, 42, so that the switching and function symbols 26, 42 are backlit here more strongly.

The control unit 16 generally can be formed as the at least partly electrically conductive trim 18, as can be taken in particular from the exploded view of FIG. 3.

Thus, a motor vehicle control device 10 is created, which can be used as window lifter module 12, wherein the window function such as "close window" is formed via a capacitive control unit 16, in particular a capacitive actuating element 32 correspondingly protruding to the outside. It thereby is ensured that an inadvertent activation of the function "close window" can be prevented.

The invention claimed is:

1. A motor vehicle control device, comprising an at least partly electrically conductive control unit including a control surface and a printed circuit board associated to the control unit, which comprises several electrodes, wherein the control unit includes at least one actuating area which is provided on a capacitive actuating element protruding from the control surface to the outside, wherein the at least one actuating area is provided on a side face of the actuating element wherein the side face is substantially vertical to the control surface, wherein the control unit is formed such that the capacitive actuating element protruding from the control surface to the outside is to be contacted on two actuating surfaces at the same time, in order to activate an associated function, and wherein the two actuating surfaces are provided on the capacitive actuating element protruding to the outside.

2. The motor vehicle control device according to claim 1, wherein the two actuating surfaces are provided on opposite surfaces of the actuating element.

3. The motor vehicle control device according to claim 1, wherein a control area is provided.

4. The motor vehicle of claim 3, wherein the control area is formed as a capacitive sliding area.

5. The motor vehicle control device according to claim 1, wherein on the control surface at least one adjusting area is provided, which comprises control areas formed on the control surface.

6. The motor vehicle control device according to claim 1, wherein on the control surface a function display area is provided, via which a selected function is displayed, when the same is selected.

7. The motor vehicle control device according to claim 1, wherein a search illumination and/or a selection illumination is provided.

8. The motor vehicle control device according to claim 1, wherein the printed circuit board includes at least one light transmission opening.

9. The motor vehicle control device according to claim 1, wherein at least one light guide is provided, which is associated to the printed circuit board.

10. The motor vehicle control device according to claim 1, wherein the control unit is formed as a trim which comprises several switching symbols and/or function symbols, which at least include transparent portions.

11. The motor vehicle control device of claim 10, wherein the at least one light guide is associated to the at least one light transmission opening.

12. The motor vehicle control device according to claim 1, wherein the motor vehicle control device is a window lifter module.

13. A motor vehicle control device, comprising an at least partly electrically conductive control unit including a control surface and a printed circuit board associated to the control unit, which comprises several electrodes, wherein the control unit includes at least one actuating area which is provided on a capacitive actuating element protruding from the control surface to the outside, wherein the at least one actuating area is provided on a side face of the actuating element, wherein the side face is substantially vertical to the control surface, and wherein the actuating element is configured to detect whether the side face is touched with one or two fingers at the same time, so that the function "close window" only is executed when two fingers contact the actuating element at the same time.

* * * * *